(12) United States Patent
Pratt et al.

(10) Patent No.: US 7,955,946 B2
(45) Date of Patent: Jun. 7, 2011

(54) METHODS OF DETERMINING X-Y SPATIAL ORIENTATION OF A SEMICONDUCTOR SUBSTRATE COMPRISING AN INTEGRATED CIRCUIT, METHODS OF POSITIONING A SEMICONDUCTOR SUBSTRATE COMPRISING AN INTEGRATED CIRCUIT, METHODS OF PROCESSING A SEMICONDUCTOR SUBSTRATE, AND SEMICONDUCTOR DEVICES

(75) Inventors: Dave Pratt, Meridian, ID (US); Kyle Kirby, Boise, ID (US); Steve Oliver, Boise, ID (US); Mark Hiatt, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 653 days.

(21) Appl. No.: 11/439,078

(22) Filed: May 22, 2006

(65) Prior Publication Data

US 2007/0269994 A1 Nov. 22, 2007

(51) Int. Cl.
*H01L 21/76* (2006.01)
(52) U.S. Cl. ........ 438/401; 438/462; 438/975; 438/800; 257/797; 257/E23.179; 257/E21.525
(58) Field of Classification Search .................... 438/113, 438/401, 637, 667, 672, 675, 678, 800; 257/797, 257/E23.179, E21.525; 738/401, 462, 975
See application file for complete search history.

(56) References Cited

U.S. PATENT DOCUMENTS

| | | | |
|---|---|---|---|
| 4,052,603 A * | 10/1977 | Karlson | 700/192 |
| 6,300,670 B1 | 10/2001 | Kramer et al. | |
| 6,746,953 B2 * | 6/2004 | Kramer et al. | 438/637 |
| 6,790,775 B2 * | 9/2004 | Fartash | 438/667 |
| 6,841,883 B1 | 1/2005 | Farnworth et al. | |
| 6,861,186 B1 | 3/2005 | Pagette et al. | |
| 6,912,078 B2 | 6/2005 | Kudrle et al. | |
| 6,943,106 B1 | 9/2005 | Kirby et al. | |
| 7,019,402 B2 * | 3/2006 | Andry et al. | 257/763 |
| 2002/0076853 A1 * | 6/2002 | Kramer et al. | 438/113 |
| 2002/0146200 A1 | 10/2002 | Kudrle et al. | |
| 2004/0188819 A1 | 9/2004 | Farnworth | |
| 2005/0046038 A1 | 3/2005 | Farnworth | |
| 2005/0250292 A1 * | 11/2005 | Baluswamy et al. | 438/401 |
| 2006/0035159 A1 * | 2/2006 | Best et al. | 430/22 |
| 2006/0043535 A1 * | 3/2006 | Hiatt | 257/621 |

* cited by examiner

*Primary Examiner* — Benjamin P Sandvik
*Assistant Examiner* — Farid Khan
(74) *Attorney, Agent, or Firm* — Wells St. John, P.S.

(57) ABSTRACT

The invention includes methods of determining x-y spatial orientation of a semiconductor substrate comprising an integrated circuit, methods of positioning a semiconductor substrate comprising an integrated circuit, methods of processing a semiconductor substrate, and semiconductor devices. In one implementation, a method of determining x-y spatial orientation of a semiconductor substrate comprising an integrated circuit includes providing a semiconductor substrate comprising at least one integrated circuit die. The semiconductor substrate comprises a circuit side, a backside, and a plurality of conductive vias extending from the circuit side to the backside. The plurality of conductive vias on the semiconductor substrate backside is examined to determine location of portions of at least two of the plurality of conductive vias on the semiconductor substrate backside. From the determined location, x-y spatial orientation of the semiconductor substrate is determined. Other aspects and implementations are contemplated.

42 Claims, 15 Drawing Sheets

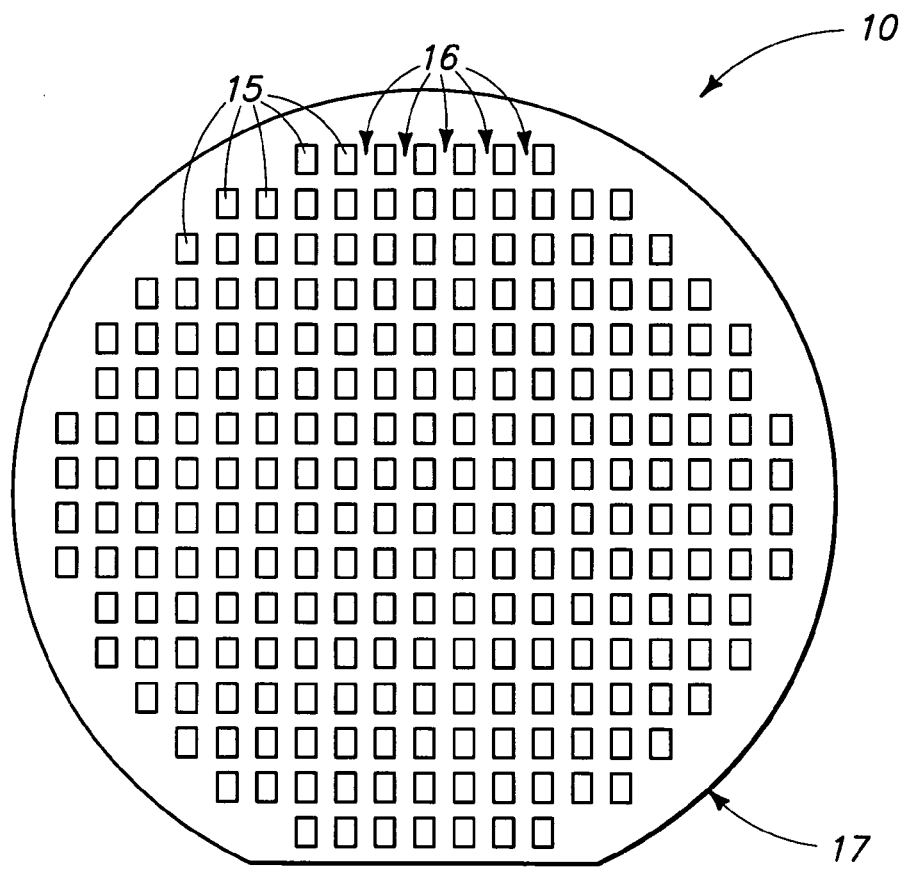
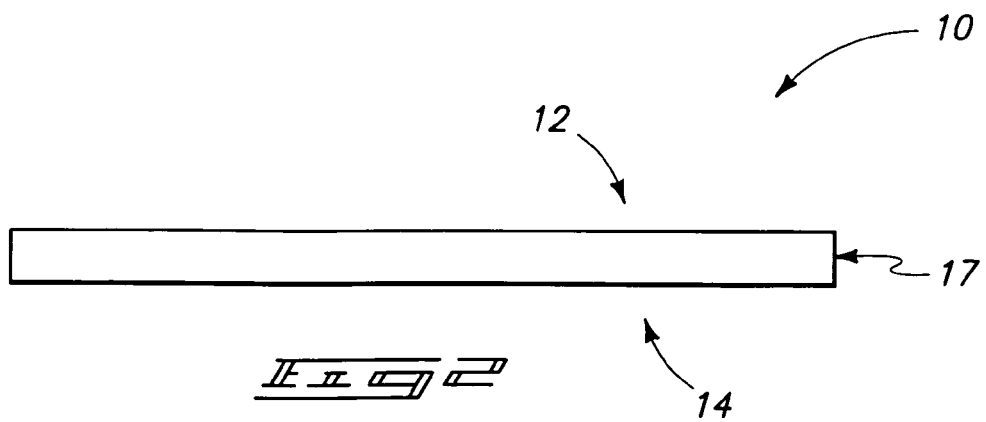

METHODS OF DETERMINING X-Y SPATIAL ORIENTATION OF A SEMICONDUCTOR SUBSTRATE COMPRISING AN INTEGRATED CIRCUIT, METHODS OF POSITIONING A SEMICONDUCTOR SUBSTRATE COMPRISING AN INTEGRATED CIRCUIT, METHODS OF PROCESSING A SEMICONDUCTOR SUBSTRATE, AND SEMICONDUCTOR DEVICES

TECHNICAL FIELD

This invention relates to methods of determining x-y spatial orientation of a semiconductor substrate comprising an integrated circuit, to methods of positioning a semiconductor substrate comprising an integrated circuit, to methods of processing a semiconductor substrate, and to semiconductor devices.

BACKGROUND OF THE INVENTION

Integrated circuits are typically fabricated onto and within a monolithic substrate. A typical result is a semiconductor device encompassed into or by a chip/die. Such is usually encapsulated within a solidified liquid encapsulant which is bonded or connected with another substrate, for example to a printed circuit board or encapsulated with a lead frame which is ultimately joined with a printed circuit board or another substrate. Typically, a plurality of integrated circuit chips or die is fabricated onto and from a single larger wafer or substrate. At the conclusion of fabricating the integrated circuit die, the larger substrate is typically cut to form singulated individual integrated circuit chips.

Typical fabrication of an integrated circuit occurs almost entirely relative to one side of a semiconductor substrate, typically referred to as the circuit side or frontside. Yet in many instances, it is the backside of the semiconductor substrate that is conductively and operatively connected with a lead frame or other substrate after dicing into individual chips. A typical manner of providing substrate backside conductive contacts for electrically connecting with the lead frame or other substrate includes the fabrication of through wafer interconnects. Such are conductive paths which typically extend perpendicularly from the circuit side of the substrate to the backside of the substrate.

Bond pads are typically fabricated over an area of the substrate below which no circuitry has been created lower within the substrate. Such might be provided in a single row or column over a central area of the circuit side of the substrate, in multiple rows/columns, around the perimeter of the die area, etc. Regardless, through wafer interconnects are typically first formed by patterning a series of openings of a common shape on the substrate frontside through the bond pads and partially into the substrate material therebelow. Internal walls of the openings down within the substrate are then insulated. The openings are then filled with conductive material which electrically connects with areas of the frontside bond pads.

The backside of the substrate is then typically polished to expose the conductive material formed within the openings, thereby providing a conductive pattern of conductive interconnects which extend form the circuit side of the substrate to its backside in a self-aligned manner to the patterning of such openings through the bond pads which occurred on the circuit side of the substrate.

In most instances, it is desirable to provide a patterned protective dielectric passivation layer over the backside of the substrate and to assure electric isolation between adjacent through wafer interconnects and intervening material of the substrate. However, alignment marks for mask placement/alignment are not typically provided on the backside of the substrate. Further even if such were provided, they would be removed by the above typical processing where the backside is polished to expose the conductive material of the through wafer interconnects.

If patterning of the material on the backside of such a substrate is desired, typical existing methods examine the substrate frontside for the appropriate alignment marks, and then suitable x-y axis substrate positioning/moving is conducted for the desired processing or action to be taken relative to the substrate backside. Such typically requires underside examination of the frontside of the substrate from below. This can be problematic when the substrate frontside is resting upon a surface which must thereby typically be made transparent to enable the typical optical imaging equipment to see the underside of the substrate. Alternately, equipment must be designed to view the alignment marks on and from the substrate frontside in order to align the substrate backside.

Further and regardless, a singulated chip must also be properly aligned relative to a lead frame or other substrate to which the backside of the integrated circuit chip is to be connected. The absence of alignment marks on the backside of the integrated circuit chip can make it difficult to properly align the backside of the chip for desired placement or bonding with another substrate to which the chip backside electrically connects.

While the invention was motivated in addressing the above identified issues, it is in no way so limited. The invention is only limited by the accompanying claims as literally worded, without interpretative or other limiting reference to the specification, and in accordance with the doctrine of equivalents.

BRIEF DESCRIPTION OF THE DRAWINGS

Preferred embodiments of the invention are described below with reference to the following accompanying drawings.

FIG. 1 is a diagrammatic top plan view of a semiconductor substrate.

FIG. 2 is a side elevational view of the FIG. 1 substrate.

DETAILED DESCRIPTION OF THE PREFERRED EMBODIMENTS

Figure 3:
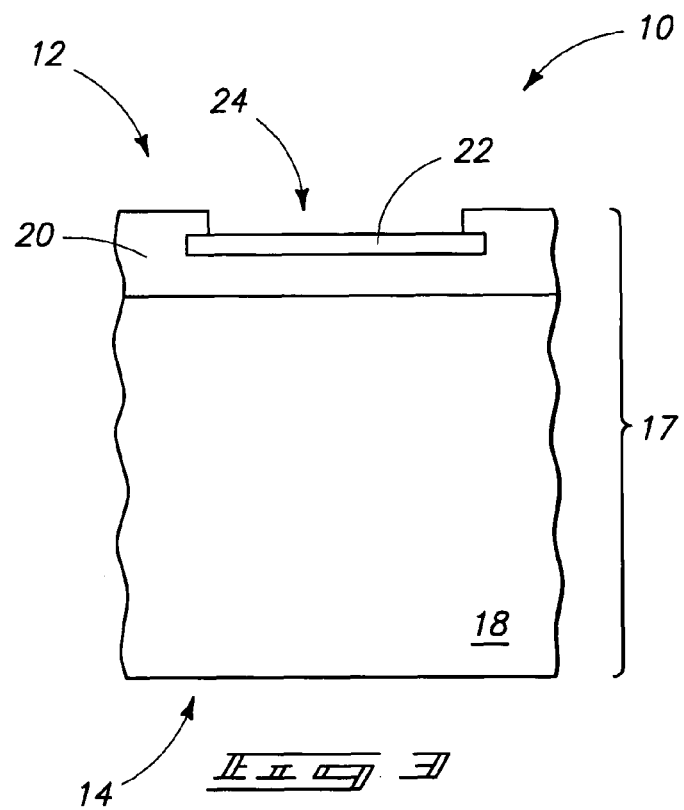
FIG. 3 is a diagrammatic sectional view of a portion of the FIG. 1 substrate.

This disclosure of the invention is submitted in furtherance of the constitutional purposes of the U.S. Patent Laws "to promote the progress of science and useful arts" (Article 1, Section 8).

Exemplary methods and exemplary semiconductor devices in accordance with various aspects of the invention are described in preferred embodiments with reference to FIGS. 1-21. Referring initially to FIGS. 1 and 2, a semiconductor substrate is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 comprises a frontside 12 and a backside 14. An integrated circuit (one or more) has been fabricated relative to semiconductor substrate frontside 12, with frontside 12 also comprising a circuit side of the substrate from which at least a majority portion of the circuitry is fabricated.

In the depicted exemplary, initially-described embodiment, semiconductor substrate 10 comprises a plurality of integrated circuit die or die sites 15 having street area 16 therebetween. However, aspects of the invention also contemplate a semiconductor substrate comprising only a single integrated circuit die or another single integrated circuit substrate. Semiconductor substrate 10 is depicted, by way of example only, as comprising a monolithic substrate 17 within and upon which integrated circuit device components (not otherwise specifically shown or designated) have been fabricated at least in this point in a preferred exemplary process. An aspect of the invention contemplates the fabricating of an integrated circuit (i.e., any one or combination of die 15) relative to semiconductor frontside 12. Such may also include some processing relative to backside 14, but at least includes majority circuitry fabrication relative to frontside 12.

By way of example only, substrate 17 might initially, and at this point of processing, predominantly comprise a bulk monocrystalline silicon substrate wafer. The lower depicted half of such might not contain any circuitry or circuit devices at least at this point of processing in but one preferred method in accordance with an aspect of the invention. Preferred and typical processes of fabricating integrated circuitry relative to frontside 12 comprise lithographic patterning of substrate frontside 12, for example utilizing sacrificial photoresist, non-sacrificial imaging layers, and/or other masking layers within which subtractive and/or additive features have been formed utilizing a plurality of masking and deposition steps.

By way of example only, FIG. 3 depicts a cross-section of an exemplary portion of semiconductor substrate 10 within which an integrated circuit has been substantially fabricated. FIG. 3 diagrammatically depicts substrate 17 as comprising bulk substrate material 18 and one or more overlying dielectric/insulative passivation layers 20. A conductive bond pad 22 is diagrammatically shown relative to passivation layer 20, and an opening 24 is provided therethrough to bond pad 22. Conductive bond pads 22 typically comprise enlarged conductive metal areas to which wires or other components connect for connecting the integrated circuit with another substrate. Conductive bond pads 22 are typically fabricated in a single straight line along either the length or width of an integrated circuit die. However, aspects of the invention contemplate fabrication of conductive bond pads in any desired manner including, by way of example only, in one or more multiple rows or clusters, and of any one or combination of individual shapes of conductive bond pads 22. Conductive bond pads 22 are typically fabricated to be received over substrate area directly therebeneath wherein no circuit traces or circuit components have been fabricated. This enables conductive vias to be fabricated from substrate circuit side 12 to substrate backside 14 directly through the substrate, for example as will be described in preferred embodiments in the continuing discussion.

Figure 4:
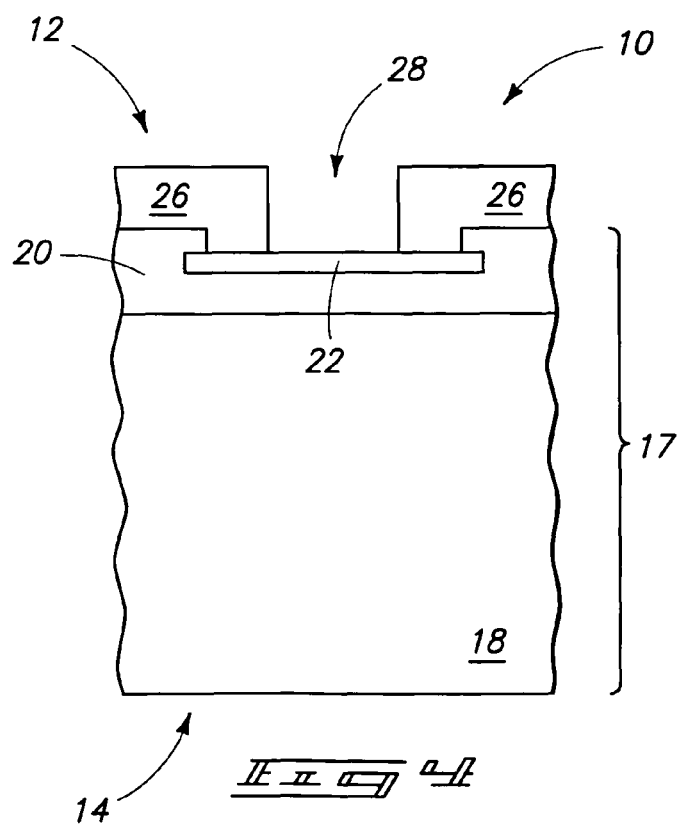
FIG. 4 is a view of the FIG. 3 substrate at a processing sequence subsequent to that depicted by FIG. 3, and diagrammatically taken through line 4-4 in FIG. 5.
Figure 5:
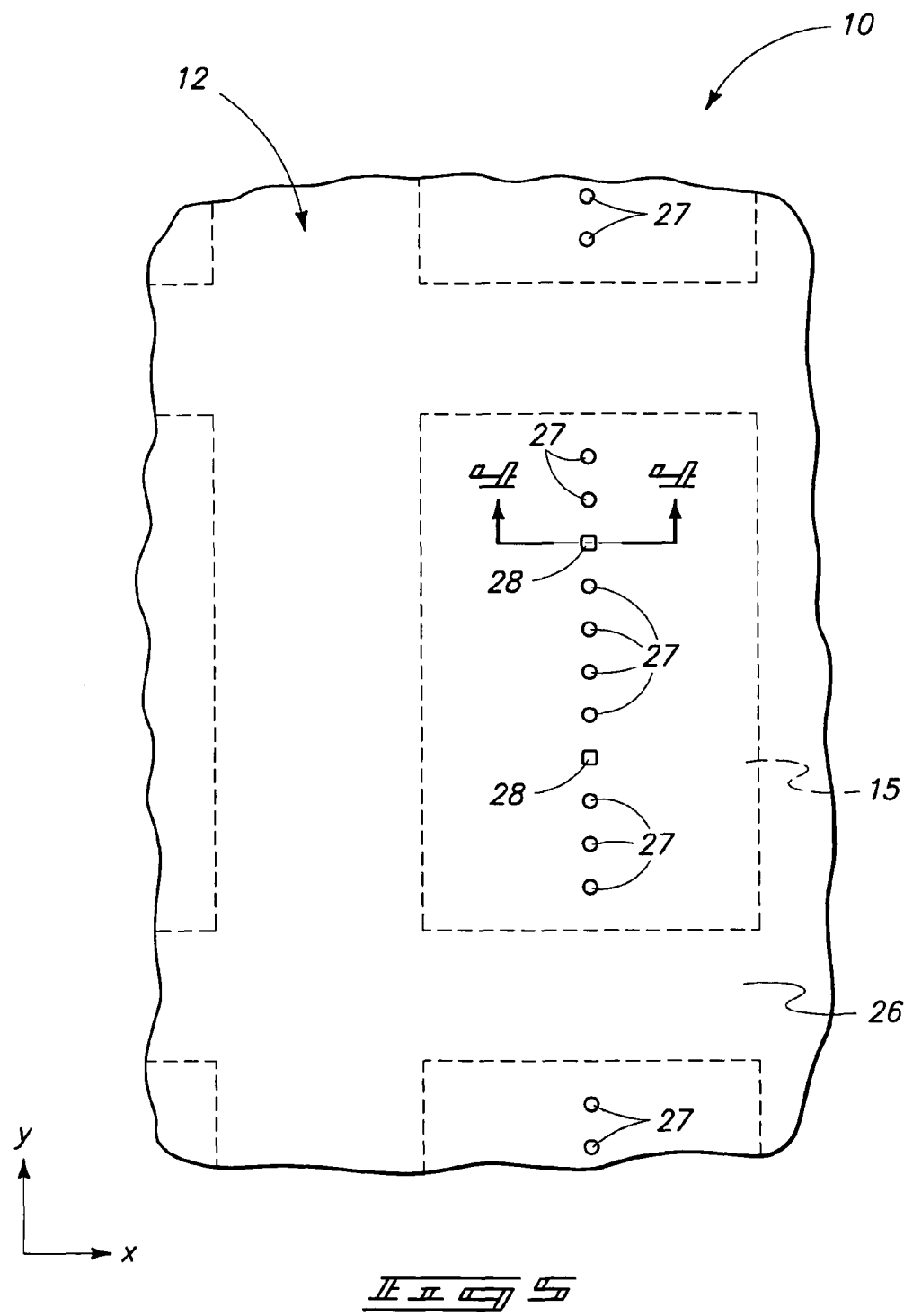
FIG. 5 is a diagrammatic top plan view of a portion of the FIG. 4 substrate.

Referring to FIGS. 4 and 5, an exemplary masking layer 26 is depicted as being received over passivation layer 20 on substrate frontside 12, and has been lithographically patterned to form a column of openings 27, 28 therethrough to conductive bond pads 22. In certain implementations, openings 27, 28 have been collectively patterned lithographically to be used to form at least two backside alignment marks on substrate backside 14. At some point, as will be described subsequently, semiconductor substrate backside 14 will preferably be examined to determine the location of at least two backside alignment marks on semiconductive substrate backside 14. Accordingly, distinguishing characteristics relative to x-y axis shape and/or x-y axis orientation/grouping of at least two alignment marks on semiconductive substrate backside 14 are ideally provided, as will become apparent. In one implementation, at least two marks and/or at least two through wafer interconnects have some unique cross-section at a plane defined by the backside relative to all other alignment marks and/or through wafer interconnects.

FIG. 5 depicts an exemplary at least two openings 28 of an exemplary plurality of conductive openings 27, 28 in one preferred embodiment which have some unique x-y shape relative to all other openings 27. In the context of this document, "x-y" refers to configuration or orientation relative to exemplary x and y axes, for example as would be constituted by a horizontal line and a vertical line as shown in FIG. 5. In the depicted exemplary FIG. 5 configuration, openings 27 are generally circular, whereas openings 28 are generally square. In one preferred implementation, openings 27, 28 will be utilized to create at least two alignment marks on substrate backside 14 of essentially the same x-y shape as appearing on the substrate frontside 12. In but one preferred embodiment, FIG. 5 depicts at least two openings 28 having some unique x-y shape relative to all other opening shapes except openings 28. Accordingly in one preferred embodiment, other die 15 do not comprise the FIG. 5 depicted orientation and/or shape of openings 28. Thereby, substrate 10 can ultimately be examined from substrate backside 14 to ascertain where at least portions of alignment marks on substrate backside 14 that result from openings 28 are located, and therefrom determining x-y spatial orientation of the backside of semiconductor substrate 10.

By way of examples only, more than two openings 28 might be provided on individual die. Alternately, only one opening 28 might be provided on a plurality of die, and regardless of whether all such openings 28 are of the same shape or position on each die in which such are provided. Conventional imaging equipment can be programmed or otherwise configured to examine an area of a substrate encompassing a plurality die. Accordingly, such existing or yet-to-be developed equipment can be configured to look at a specific area on a substrate backside to ascertain where at least portions of alignment marks on substrate backside 14 that result from frontside openings 28 are located, and therefrom determine x-y spatial orientation of the backside of semiconductor substrate 10.

Figure 6:
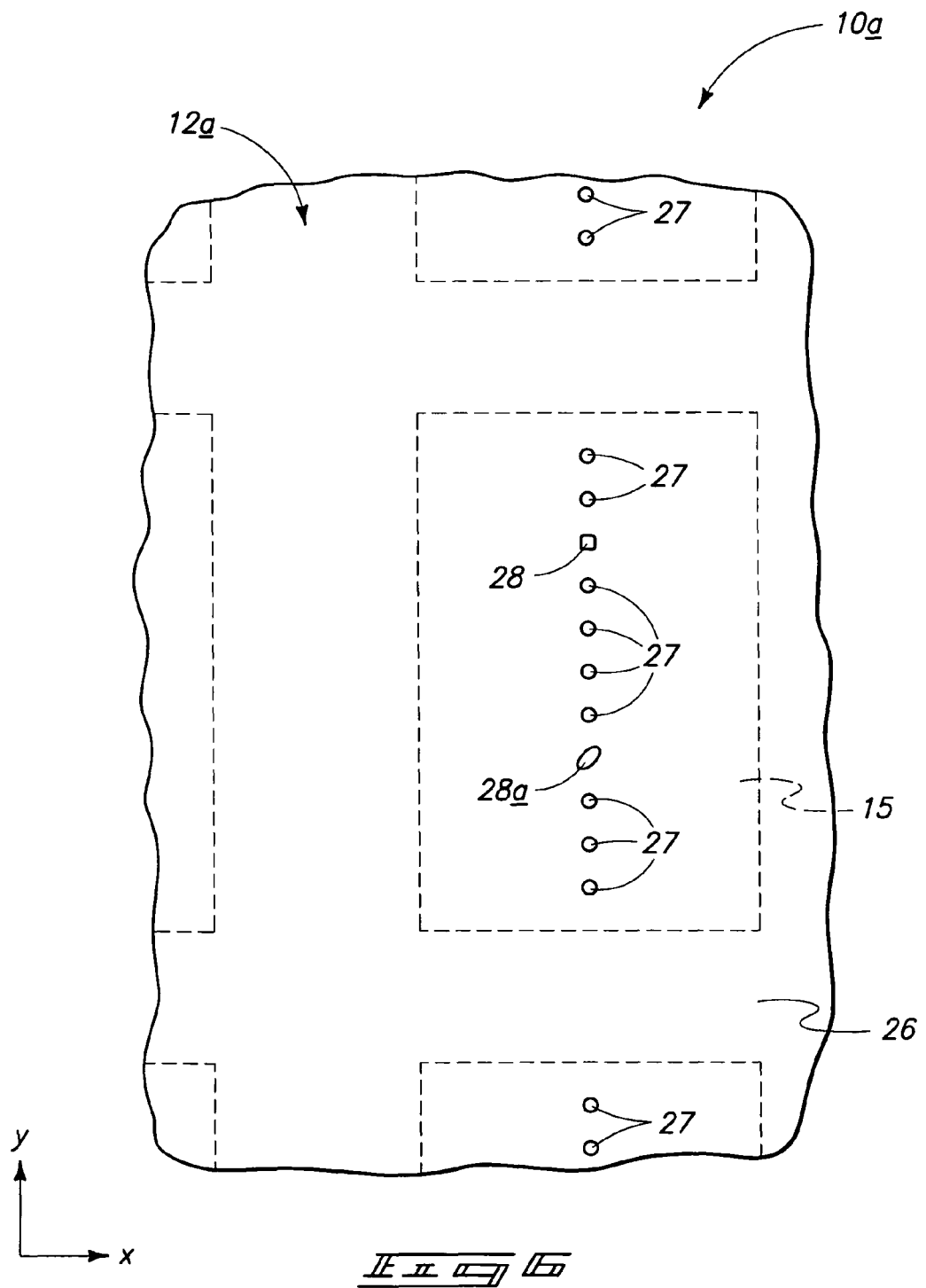
FIG. 6 is a diagrammatic top plan view of an alternate embodiment substrate to that depicted by FIG. 5.

FIG. 5 shows the depicted two openings 28 as having common x-y shape relative to one another. FIG. 6 depicts an alternate embodiment semiconductor substrate fragment 10a. Like numerals from the first-described embodiment are utilized where appropriate, with differences being indicated with the suffix "a". FIG. 6 depicts two openings 28, 28a having unique x-y shape relative to one another. For example, opening 28 is depicted as being generally square while opening 28a is depicted as being an angled oval. Of course, any alternate shapes are contemplated, for example and by way of example only, diamonds, triangles, crosses, x's, etc. Regardless, in some preferred implementations of FIG. 5-*like* and FIG. 6-*like* embodiments, not all die might have the FIGS. 5-6 opening shapes/arrangements such that backside location could be readily searched for and determined. Further, only a single die having at least two x-y distinguishable areas might be utilized. Alternately, multiple die might have the FIG. 5-*like* and FIG. 6-*like* shapes/arrangements, and conventional or yet-to-be developed imaging equipment configured to examine an area of a substrate encompassing a plurality of such die and therefrom determine x-y spatial orientation of the backside of semiconductor substrate 10.

Figure 7:
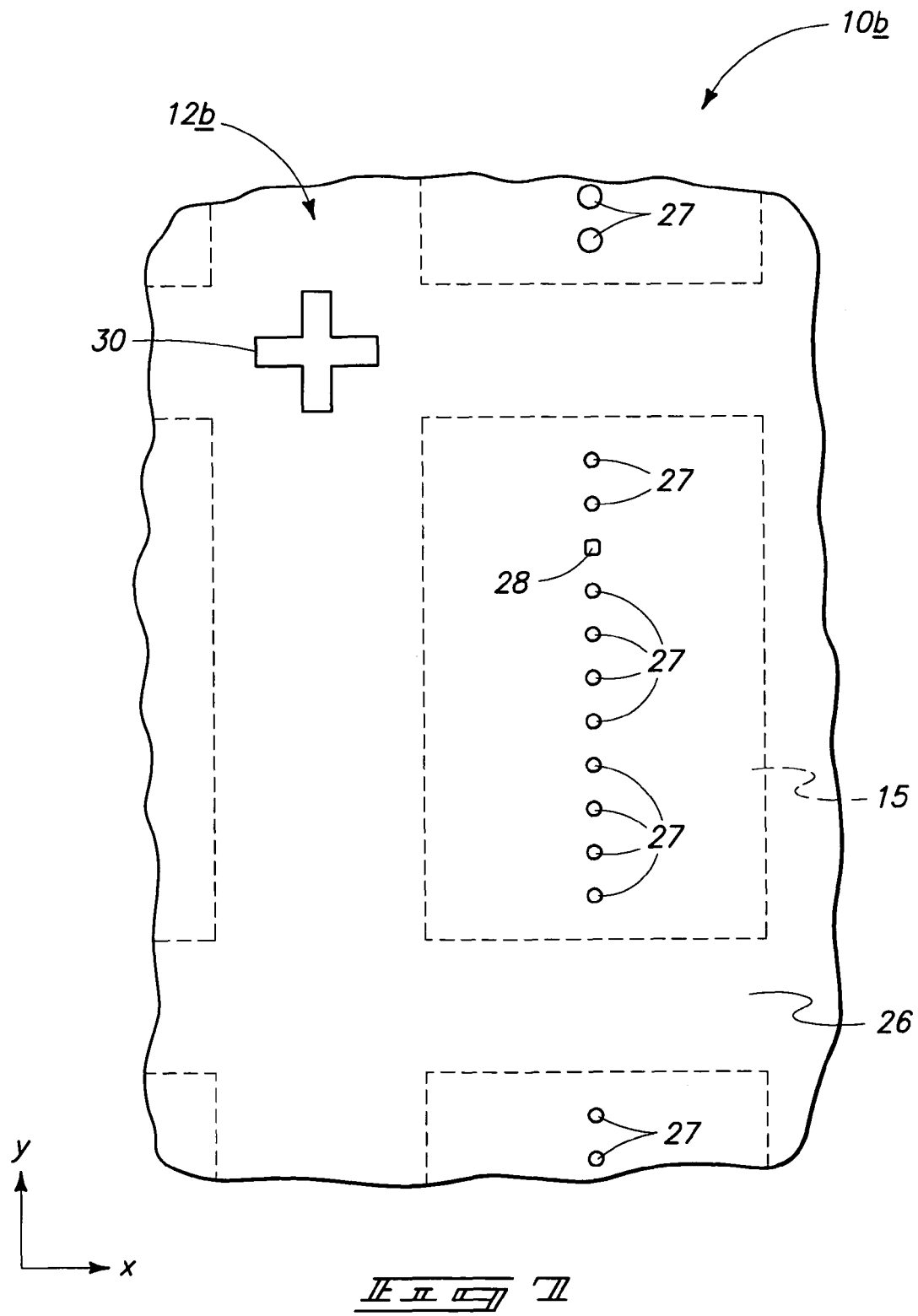
FIG. 7 is a diagrammatic top plan view of an alternate embodiment substrate to that depicted by FIG. 5.

FIG. 7 depicts an alternate exemplary embodiment semiconductor substrate 10b. Like numerals from the first-described embodiment are utilized where appropriate, with differences being indicated with the suffix "b" or with different numerals. FIG. 7 depicts an alignment mark 30 which has been fabricated within street area 16 between die 15 of the substrate. By way of example only, opening 30 is depicted as comprising a plus or cross symbol (+). Openings 30 and 28 might be of the same or different x-y shape. Further and regardless, collections or groupings of unique orientations of openings 28 and 30 might be provided relative to substrate frontside 12 (and correspondingly, ultimately to markings on backside 14 as will become apparent) for providing at least two unique areas on substrate backside 14 to be usable for determining the x-y orientation of a substrate under analysis by examining the substrate backside. Any street area alignment marks fabricated from the substrate frontside might be fabricated concurrently with fabrication of die area, or alternately separately therefrom, and whether before or after fabricating die area openings. Further and regardless, etch sequence of materials might be different in the street area versus in the die area.

Figure 8:
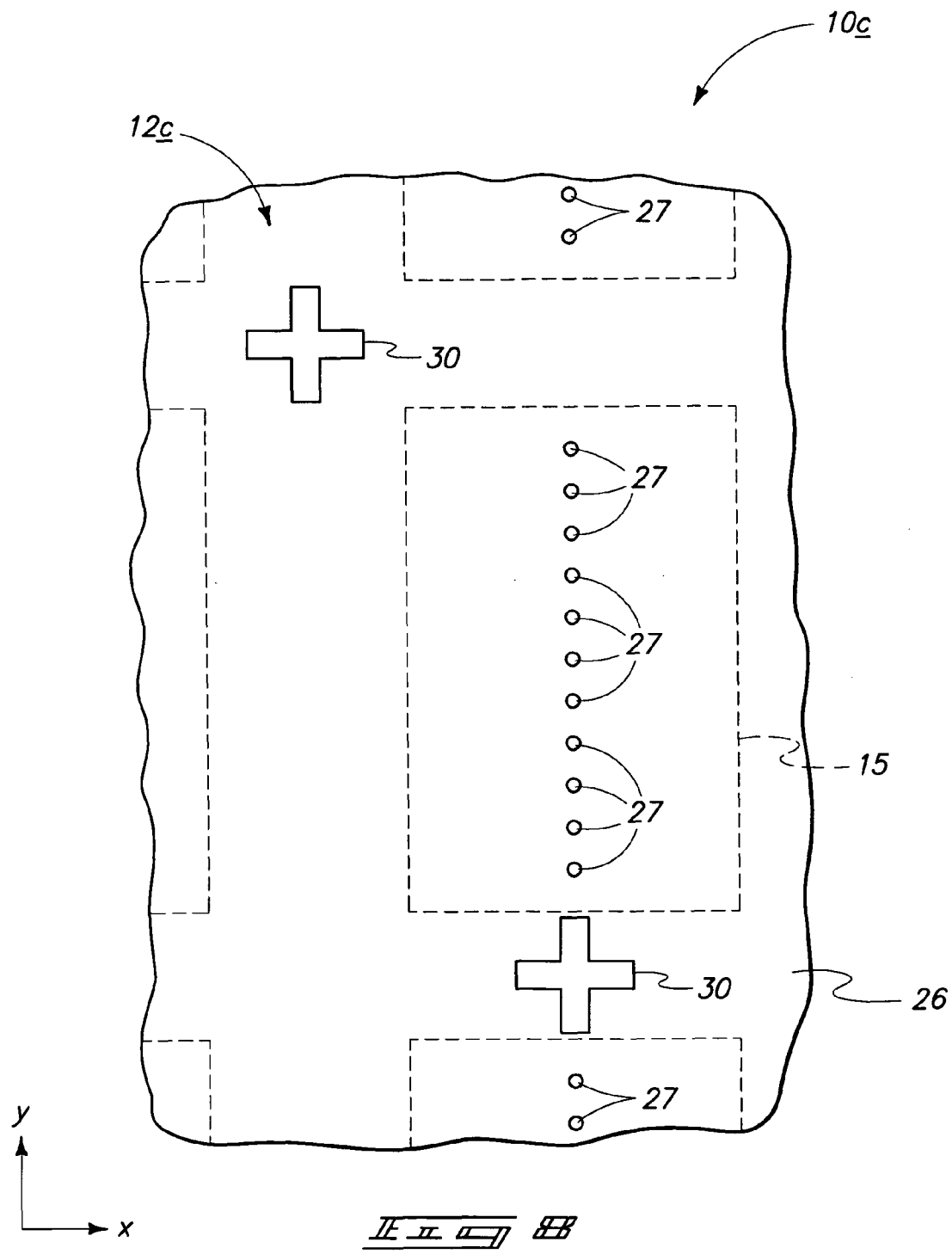
FIG. 8 is a diagrammatic top plan view of an alternate embodiment substrate to that depicted by FIG. 5.

FIG. 8, by way of example only, depicts an alternate embodiment substrate 10c. Like numerals from the first-described embodiment are utilized where appropriate, with differences being indicated with the suffix "c". Semiconductor substrate 10c includes two openings 30 located in street area 16, and where, by way of example only, openings 27 are all of common shape relative to one another. Again, openings 30 might be of common x-y shape relative to one another, or unique x-y shape relative to one another.

Figure 9:
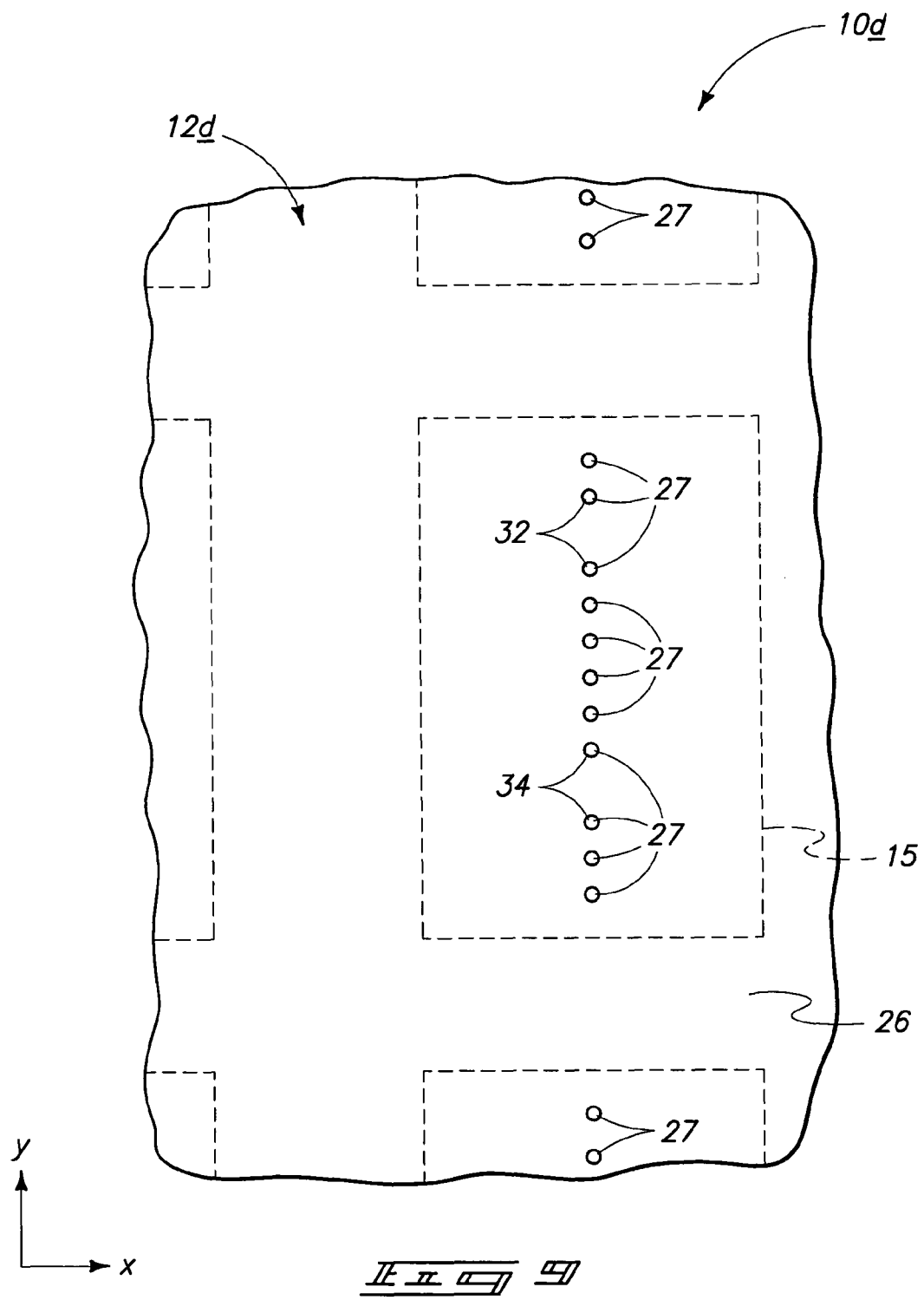
FIG. 9 is a diagrammatic top plan view of an alternate embodiment substrate to that depicted by FIG. 5.

FIG. 9 shows an alternate exemplary embodiment semiconductor substrate 10d. Like numerals from the first-described embodiment are utilized where appropriate, with differences being indicated with the suffix "d". A series of openings 27 with respect to the depicted die are of common x-y shape relative one another. However, at least two pairs of immediately adjacent openings 27 are spaced apart differently than are all other pairs of immediately adjacent openings 27. For example, FIG. 9 depicts an exemplary first pair 32 of immediately adjacent openings 27, and a second pair 34 of immediately adjacent openings 27. Each pair has a separation spacing between openings 27 within each pair which is different than the spacing between all other pairs of immediately adjacent openings 27. Accordingly, such provides at least two perceptible x-y areas which are different from other areas such that the x-y orientation of substrate 10 can be determined, as will be apparent from the continuing discussion.

Figure 10:
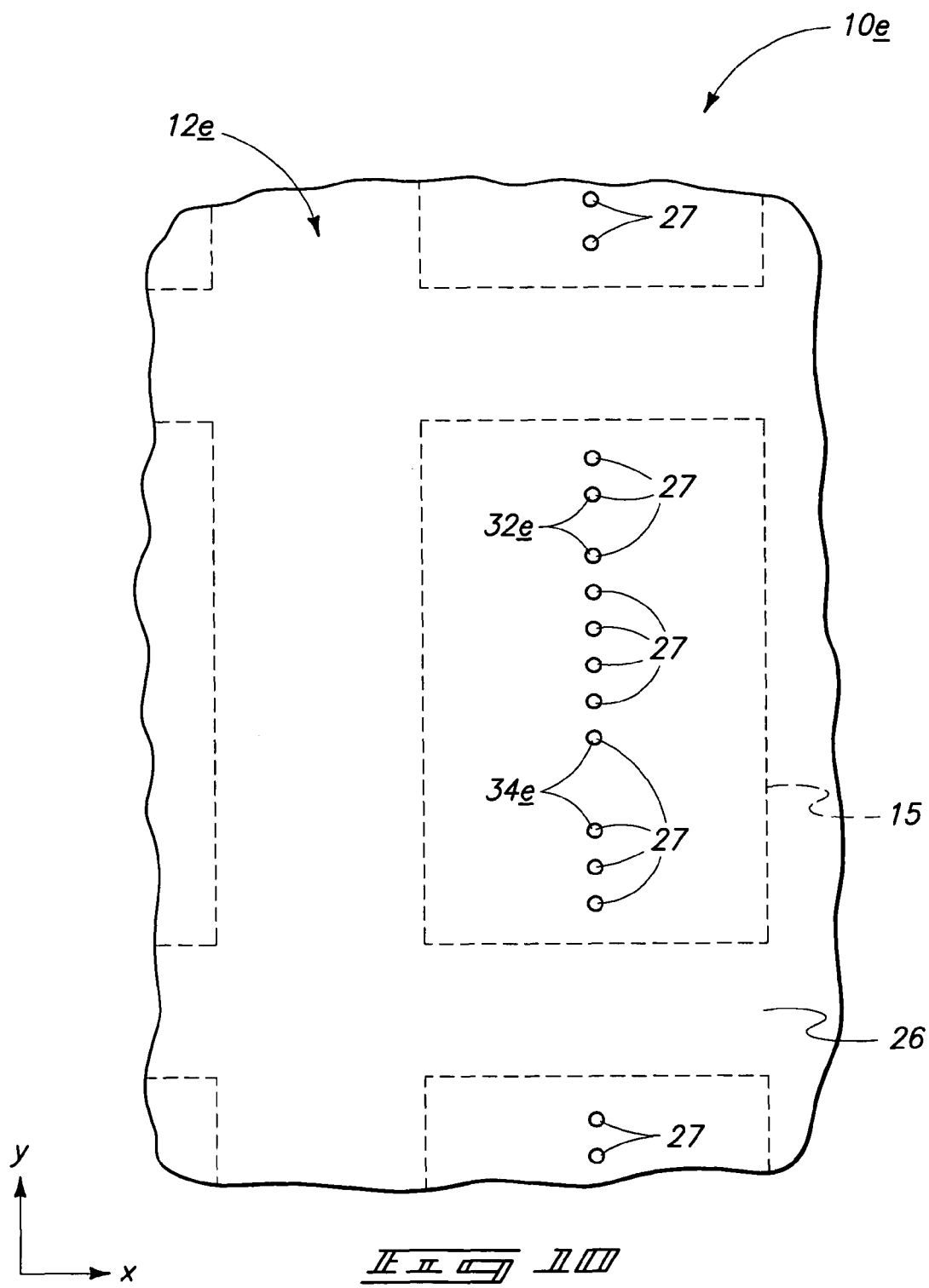
FIG. 10 is a diagrammatic top plan view of an alternate embodiment substrate to that depicted by FIG. 5.

FIG. 9 depicts an exemplary embodiment wherein pairs 32 and 34 have common backside spacing relative to one another of spacing between the immediately adjacent openings 27 of each pair. By way of example only, FIG. 10 depicts an alternate embodiment substrate fragment 10e. Like numerals from the first described embodiment are utilized where appropriate, with differences being indicated with the suffix "e". In fragment 10e, pairs 32e and 34e have unique spacing between openings 27 relative to one another. By way of example only, the spacing between immediately adjacent openings 27 for pair 34e is greater than that for pair 32e, with each being different than the spacing between all other pairs of immediately adjacent conductive vias 27 in one preferred implementation.

Figure 11:
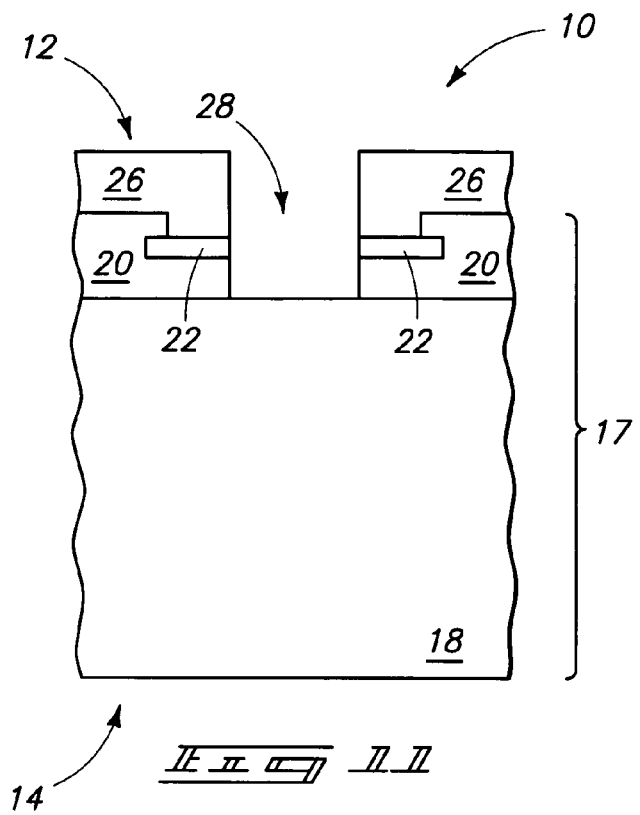
FIG. 11 is a view of the FIG. 4 substrate at a processing sequence subsequent to that depicted by FIG. 4.

FIGS. 11-18 depict exemplary subsequent processing for getting the patterns of openings 27, 28 from substrate frontside 12 to substrate backside 14. Referring to FIG. 11, openings 27, 28 have been etched into substrate 17 from substrate frontside 12 by first etching through conductive bond pad 22 and subsequently through passivation layer 20 to substrate material 18. Preferred techniques include dry anisotropic etching, typically using different chemistries for removing different materials 22 and 20. Alternately or in addition thereto, wet etching can be utilized and might be preferred in etching metal where such is used.

Figure 12:
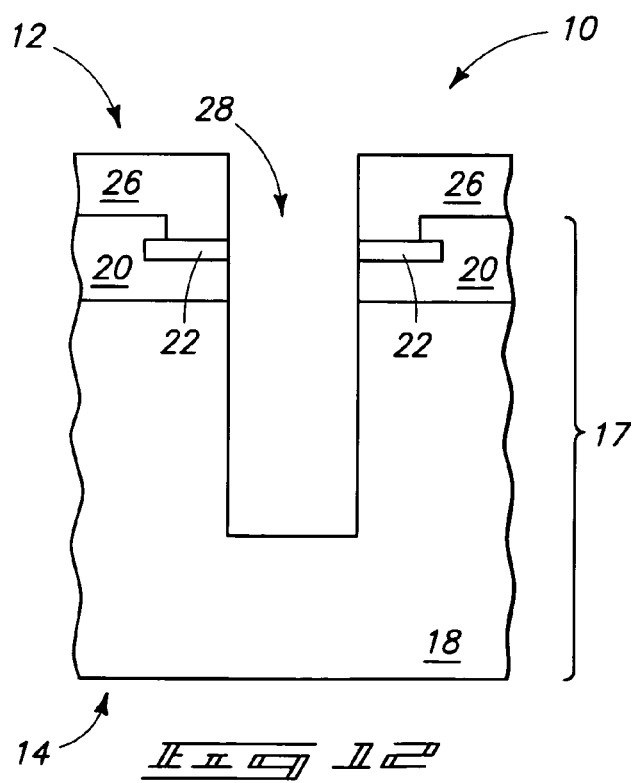
FIG. 12 is a view of the FIG. 11 substrate at a processing sequence subsequent to that depicted by FIG. 11.

Referring to FIG. 12, openings 28 have been further extended by etching into substrate material 18. Typically and preferably as shown, such etching is not, at this point in the process, completely through substrate 10, but rather such that openings 27, 28 are displaced from backside surface 14.

Figure 13:
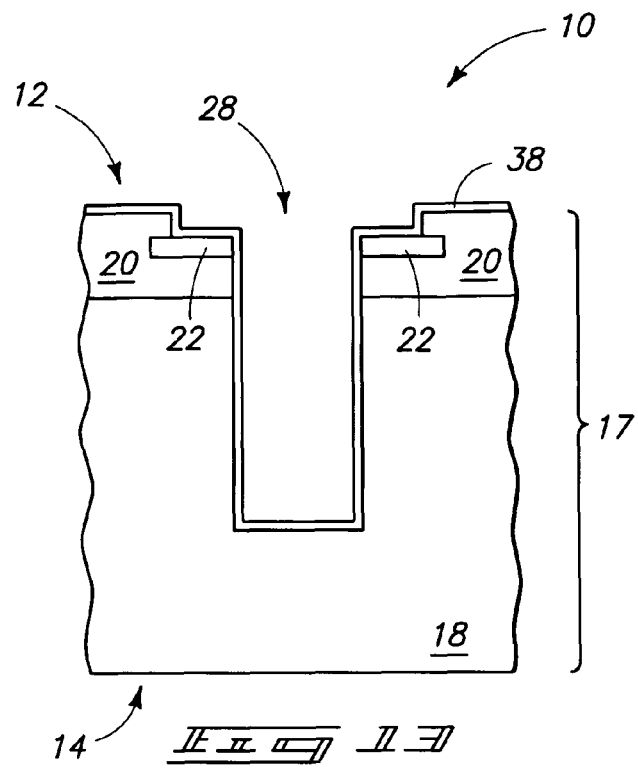
FIG. 13 is a view of the FIG. 12 substrate at a processing sequence subsequent to that depicted by FIG. 12.

Referring to FIG. 13, masking material 26 has been removed and a dielectric material 38 has been deposited as a part of substrate 10. An exemplary material is silicon dioxide and/or silicon nitride deposited to an exemplary thickness of from 0.2 micron to 2.0 microns. Alternate examples include parylene, spin on dielectrics, or other insulating polymer materials.

Figure 14:
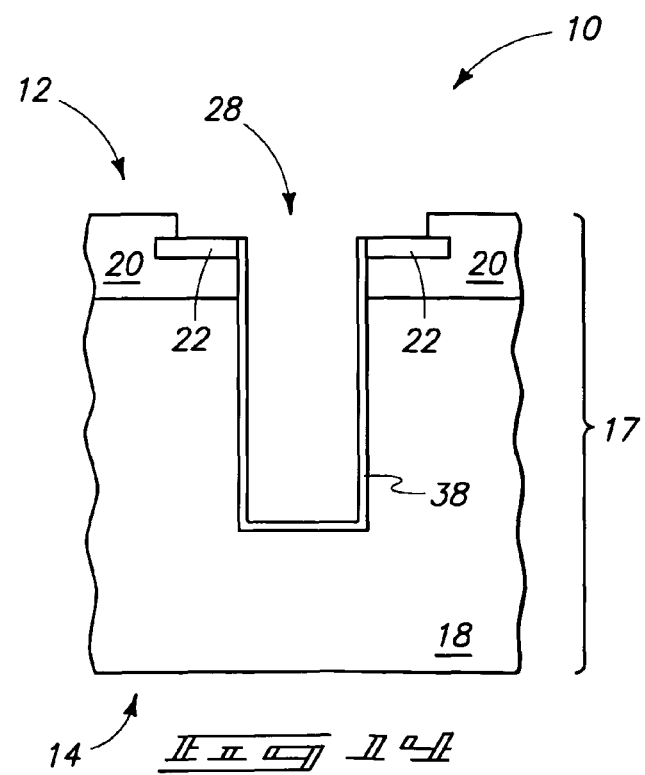
FIG. 14 is a view of the FIG. 13 substrate at a processing sequence subsequent to that depicted by FIG. 13.

Referring to FIG. 14, dielectric material 38 has been subjected to a spacer-like anisotropic etch to remove such material from being received elevationally outward of at least bond pad material 22.

Figure 15:
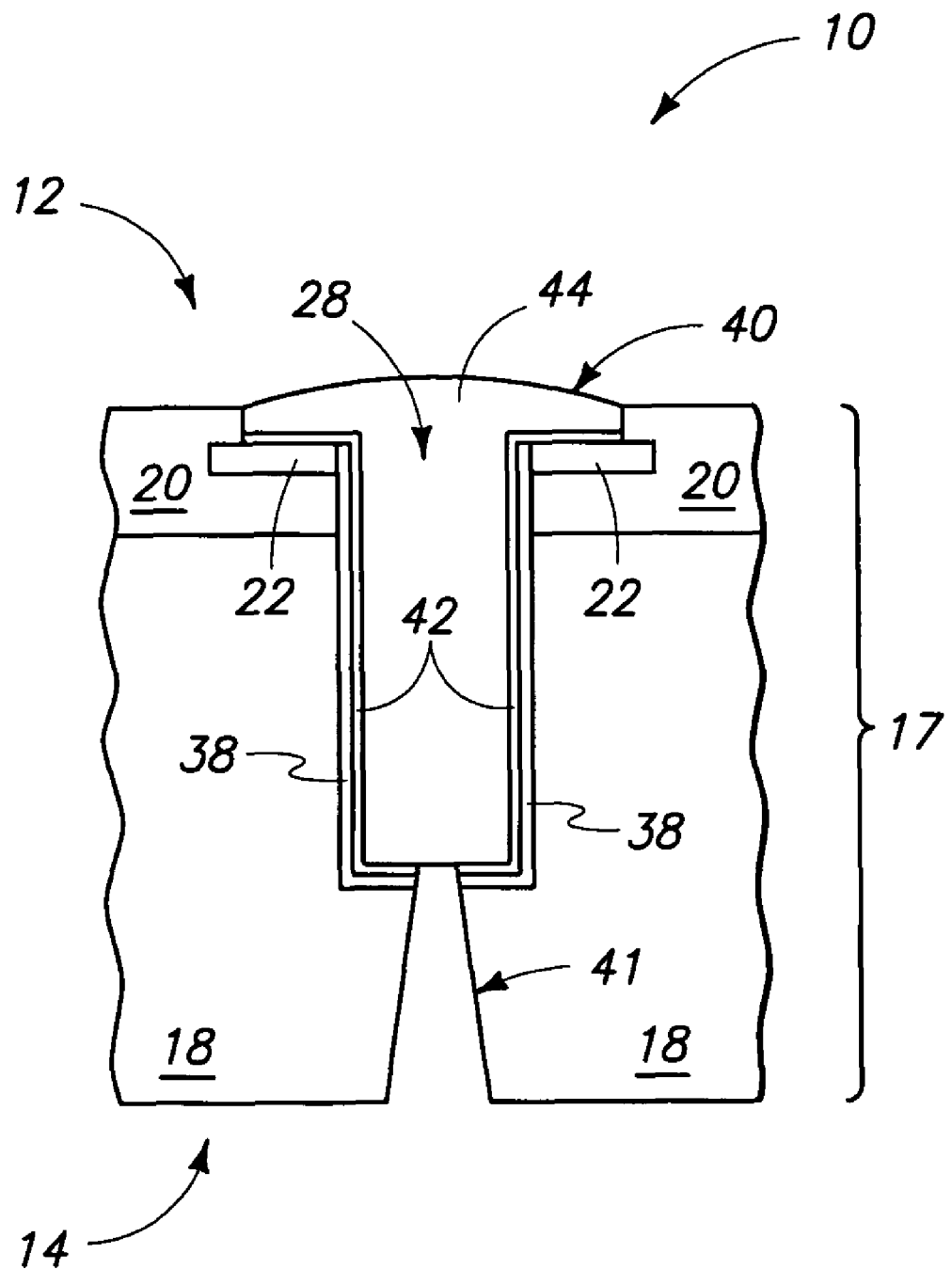
FIG. 15 is a view of the FIG. 14 substrate at a processing sequence subsequent to that depicted by FIG. 14.

Referring to FIG. 15, a vent 41 has been provided within substrate material 18, from substrate backside 14, and the remaining portions of extended opening 28 filled with conductive material 40. Conductive material 40 is depicted as comprising at least two different materials 42 and 44. An exemplary technique for forming conductive material 40 includes physical vapor deposition of a tantalum layer over substrate frontside 12, and perhaps using a physical vapor deposited Cu seed layer. A mask for electroplating could then be deposited over substrate frontside 12, and patterned to expose the area within extended openings 28. With such mask in place, one or both of copper and nickel could be electrically plated to form layer 42. The electroplating mask could then be removed, and then any remnant of conductive material over passivation layer 20 removed by one or more etching techniques. A vent 41 could then be provided from substrate backside 14 through electroplated layer 42 to extended openings 27, 28. Conductive material 44 could thereafter be deposited, with conductive solder being but one example, and with vent 41 providing an air-escape from the base of extended openings 27 and 28 to prevent the creation of air pockets. Alternate techniques are also of course contemplated, which may or may not use a vent.

Such provides but one example of providing the extended alignment mark openings 27, 28 to be filled with material. In such example, such comprises at least some conductive material such that conductive material ultimately extends from frontside 12 to backside 14 for making a conductive path that extends through the thickness of substrate 17, for example a through wafer interconnect. However, certain aspects of the invention also contemplate providing extended alignment mark openings to be filled with material that does not necessarily include some conductive material therein that ultimately extends from frontside 12 to backside 14. Further, not all alignment mark openings, or other openings, need be filled with the same material or at the same time.

Figure 16:
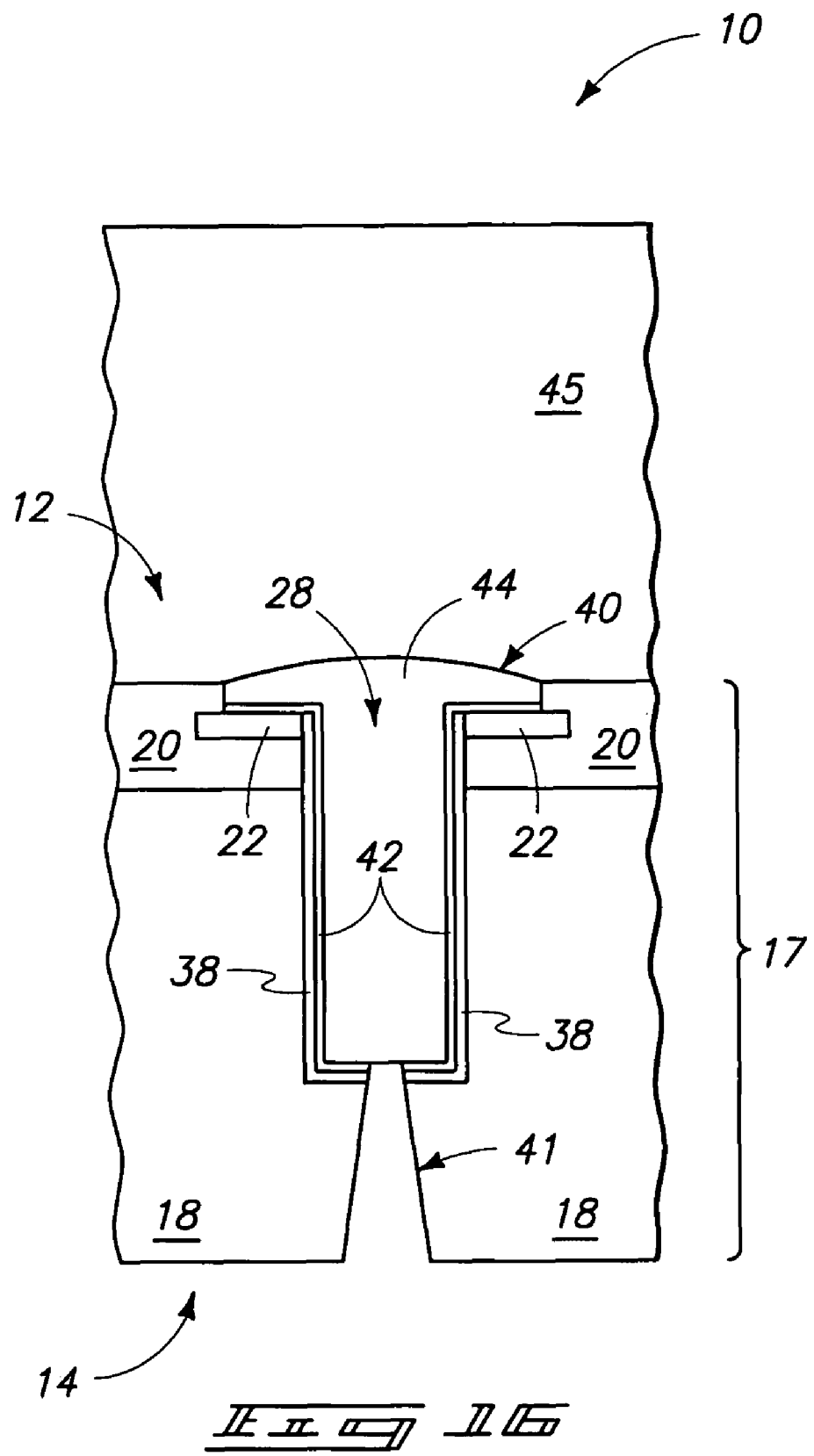
FIG. 16 is a view of the FIG. 15 substrate at a processing sequence subsequent to that depicted by FIG. 15.

Referring to FIG. 16, substrate 10 has, been joined with a temporary carrier substrate 45.

Figure 17:
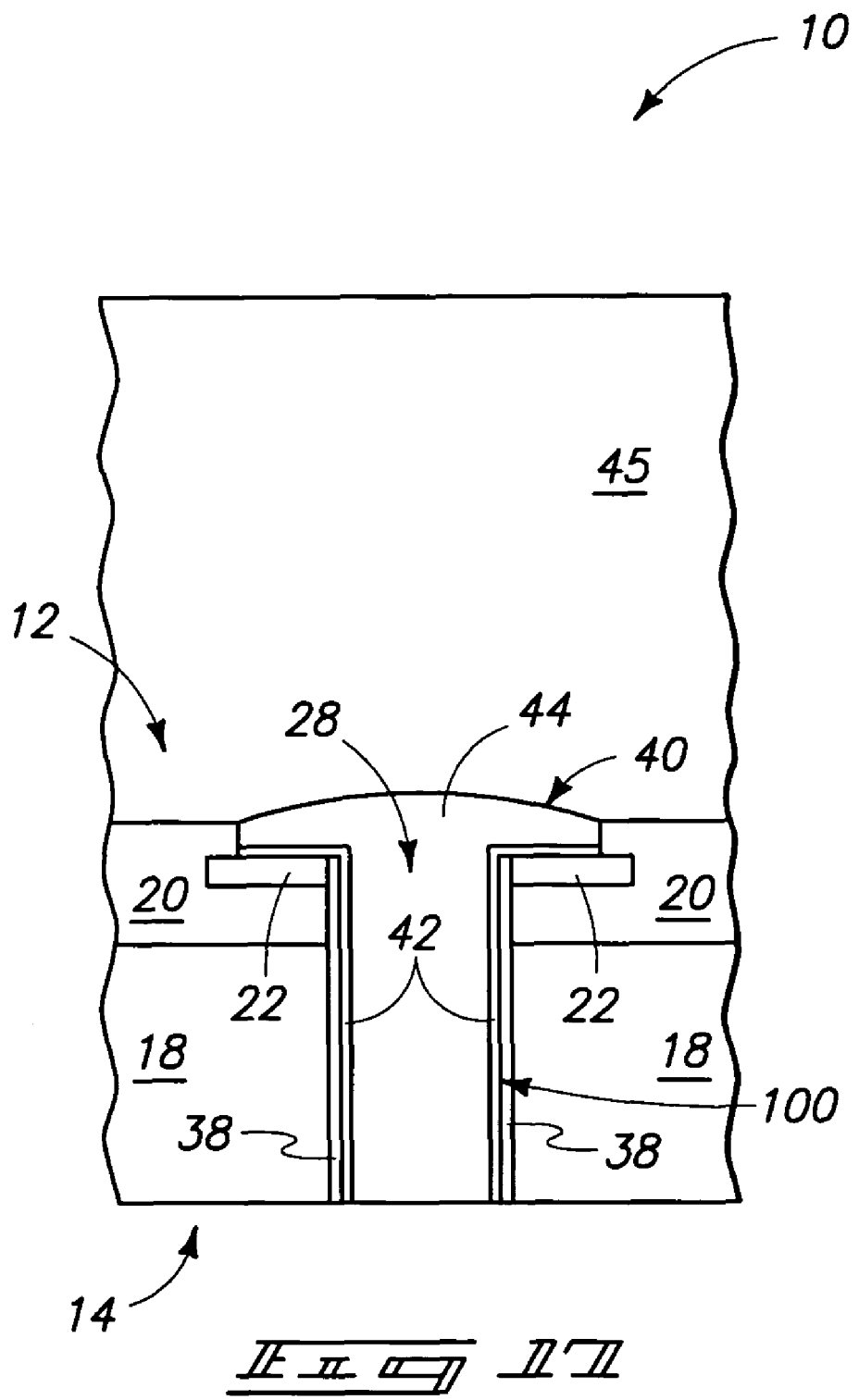
FIG. 17 is a view of the FIG. 16 substrate at a processing sequence subsequent to that depicted by FIG. 16.
Figure 18:
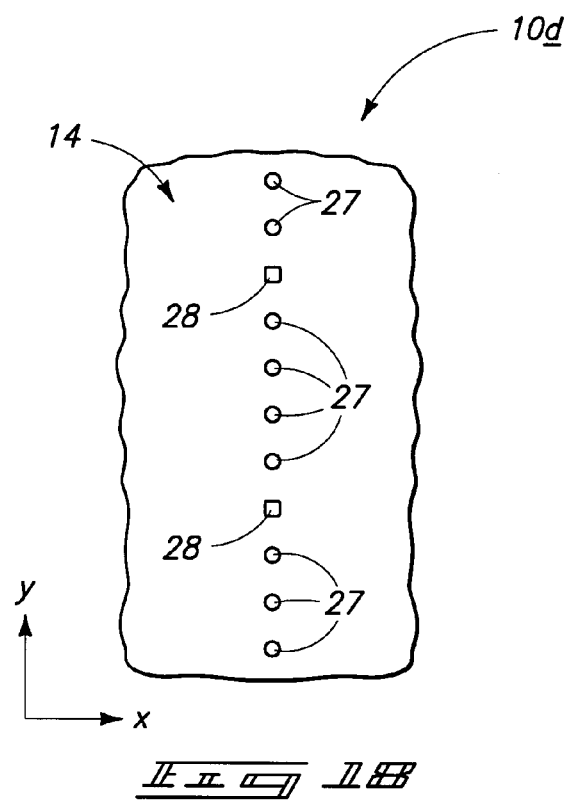
FIG. 18 is a diagrammatic plan view of the backside of a portion of the FIG. 17 substrate.

Referring to FIGS. 17 and 18, substrate 10 with carrier substrate 45 has been globally thinned by removing substrate material from substrate backside 14 at least to a point of exposing filled openings 27 and 28 which are, accordingly, now perceptible on semiconductor substrate backside 14. Thereby, conductive vias 100 corresponding generally in shape to previous openings 27, 28 extend from substrate frontside 12 to substrate backside 14. Alternately, substrate 10 might be thinned without being joined with a carrier substrate 45.

The above processing describes but exemplary techniques whereby at least two backside alignment mark openings are created on a substrate frontside, and the x-y configuration thereof filled and transferred to a semiconductor substrate backside. Regardless, an intended effect is to get any of the depicted x-y configurations of openings 27, 28, 28a, 30, 32e, and 34e of any of FIGS. 5-10, by way of example only, from substrate frontside 12 to substrate backside 14. Accordingly by way of example only, any of the depicted FIGS. 5-10 general opening shapes and patterns would appear on substrate backside 14. In one implementation, an aspect of the invention comprises a method of arranging a first object and a second object. A first object is provided (i.e., a lead frame or other object which is to be connected with a semiconductor substrate comprising a circuit is to connect). A second object is provided, and which comprises at least one mark on one side of said second object which is not on another side of said second object (i.e., a semiconductor substrate comprising a circuit). Then, the at least one mark is exposed on the another side of the second object (i.e., by the above backside thinning). Then, the second object is aligned relative to the first object using the at least one mark on the another side of the second object.

Further of course, alternate processing might be conducted for getting the general opening shapes and patterns on substrate backside 14. For example and by way of example only, openings 27, 28, 28a, 30, 32e, and 34e might be etched completely through the substrate prior to filling with material. In one aspect, or implementation, a method of processing a semiconductor device includes providing a semiconductor substrate. Vias and alignment marks are formed completely through the substrate using at least one common fabrication act. In one implementation, the fabrication act comprises etching at least one via site and at least one alignment mark site simultaneously. In one implementation, the fabrication act comprises filling at least one via site and at least one alignment mark site simultaneously.

In one preferred exemplary implementation, the above processing describes but one method of providing a semiconductor substrate comprising at least one integrated circuit die, a semiconductor substrate comprising a circuit side and a backside, and a plurality of conductive vias extending from the circuit side to the backside. Any of openings 27, 28, 28a, 30, 32e, and 34e filled with at least some conductive material extending from circuit side 12 to backside 14 constitute an exemplary plurality of such conductive vias. One aspect of the invention contemplates a method of determining backside x-y spatial orientation of the semiconductor substrate which comprises an integrated circuit, for example any of the semiconductor substrates as described above. Such a method includes examining the plurality of conductive vias on the semiconductor substrate backside 14 to determine the location of portions of at least two of the plurality of conductive vias on the semiconductor substrate backside. From such determined location, the x-y spatial orientation of semiconductor substrate 10 can be determined or ascertained.

The most preferred manner of conducting such examining is by optically viewing the plurality of conductive vias on the semiconductor substrate backside. For example, existing conventional alignment equipment can be configured/programmed to look for any desired shapes or portions of shapes to search for alignment marks on a circuit side of a substrate. From such locating of the alignment marks, the x-y spatial orientation of the substrate being examined is determined or ascertained by such equipment. However, an examination of the backside with other-than-visible radiation might also be used and is contemplated, and whether existing or yet-to-be developed. Regardless, thereafter if desired, the substrate can be moved to a known desired x-y spatial orientation.

Aspects of the invention encompass configuring alignment equipment to examine the plurality of conductive vias on the semiconductor substrate backside to determine the location of portions of at least two of the plurality of conductive vias on the semiconductor substrate backside, and to determine the x-y spatial orientation of the substrate therefrom. The portions of at least two of the plurality of conductive vias examined or searched for on the semiconductor substrate backside might comprise all (the entirety) of the at least two of the plurality of conductive vias, or only some portion thereof. For example and by way of example only with respect to any of the FIGS. 5-8 processings, alignment equipment could be configured to search for unique shapes/areas created by any of openings 27, 28, 28e and 30 relative to each other on substrate backside 14. Such might be conducted by examining or searching for an entirety of any such shapes 27, 28, 28e and 30.

Figure 19:
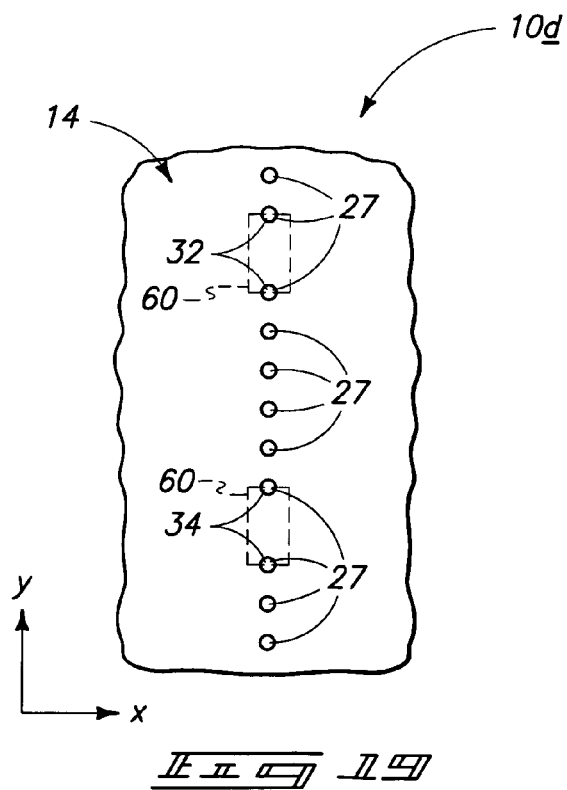
FIG. 19 is a diagrammatic plan view of the backside of a portion of a substrate corresponding to FIG. 17, but processed in accordance with FIG. 9.

Further by way of example only with respect to the FIGS. 9 and 10 embodiments, alignment examination equipment might be configured to search for only portions of a pair of adjacent openings, for example for only an approximate half of a backside x-y projection of each of the conductive vias of the depicted at least two pairs 32 and 34. For example, FIG. 19 depicts two exemplary unique x-y shapes or areas 60 of substrate 10d encompassing approximately only half of a backside x-y projection of each of conductive vias 27 of pairs 32 and 34. Such would also apply to a possible examination of the FIG. 10 embodiment whereby each of the exemplary depictions 60 (not shown) would be slightly different.

FIGS. 5, 6, 9 and 10 depict exemplary embodiments wherein the portions of the at least two conductive vias whose location is determined operably connect with conductive bond pads formed on the circuit side of the substrate. Accordingly, subsequently such conductive vias can, if desired, be utilized as backside electrical interconnects for the integrated circuit to electrically connect the same to another component or device of another substrate. FIGS. 7 and 8 depict exemplary embodiments wherein at least one of at least two conductive vias whose locations are determined does not operably connect with any operable circuit device component of any integrated circuit die. FIG. 8 depicts an embodiment wherein none of the at least two of the plurality of conductive vias whose location is determined operably connects with any operable circuit device component of any integrated circuit die.

In one exemplary and preferred implementation, the semiconductor substrate is configured to include through wafer interconnects. Such comprise an internal signal transmission system for transmitting or conductively interconnecting circuit components from a front or circuit side of a substrate to a backside of the substrate. In a most preferred embodiment, the forming of the through wafer interconnects and the forming of the plurality of conductive vias comprise some masking step that is common to the fabrication of the through wafer interconnects and the at least two of the plurality of conductive vias the location of which is utilized for ascertaining the x-y spatial orientation of the semiconductor substrate. Further in preferred embodiments, one, two, or perhaps all of the plurality of conductive vias whose locations are determined comprise a through wafer interconnect.

From a determining of the x-y spatial orientation of the semiconductor substrate as described above, such might be utilized in a number of different ways. By way of example only, such x-y spatial orientation might not be changed, and the substrate processed in some manner (either existing or yet-to-be developed) in light of the determined x-y spatial orientation. For example and by way of example only, the substrate might not be moved and another component might be bonded to the backside of the substrate based upon knowing the determined x-y orientation of the substrate.

Further, an aspect of the invention contemplates a method of positioning a substrate which comprises an integrated circuit. Such a method contemplates positioning a semiconductor substrate to a first x-y spatial orientation, for example any of the semiconductor substrates described above. Some plurality of conductive vias on the semiconductor substrate backside is examined to determine the location of portions of at least two of the plurality of conductive vias on the semiconductor substrate backside. Then, it is decided from the determined location whether the first x-y spatial orientation conforms to a desired x-y spatial orientation of the semiconductor substrate. If from such deciding the semiconductor substrate is not spatially oriented as desired, it is moved into a second x-y spatial orientation of the desired x-y spatial orientation. Accordingly in such implementation, such an aspect of the invention contemplates deciding from the determined location that the first x-y spatial orientation does not conform to the desired x-y spatial orientation of the semiconductor substrate, and thereafter conducting the stated moving to the desired orientation. Further, such aspect of the invention also contemplates deciding from the determined location that the first x-y spatial orientation conforms to the desired x-y spatial orientation of the semiconductor substrate, and thereafter conducting at least one act upon such semiconductor substrate before any moving of the semiconductor substrate from the desired x-y spatial orientation.

Aspects of the invention also contemplate x-y spatial orientation determination, for example as described above, wherein the semiconductor substrate comprises only a single integrated circuit die, for example a final integrated circuit die ready for mounting to another substrate and/or connection with a lead frame or other interconnect device.

Figure 20:
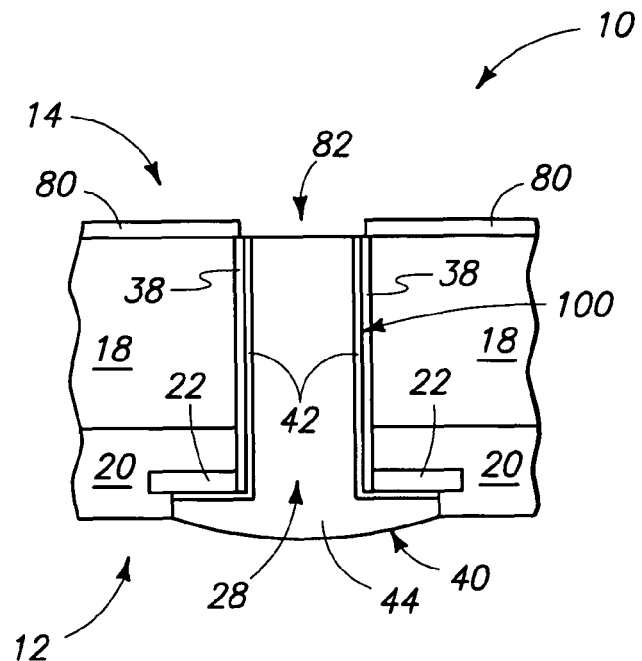
FIG. 20 is a view of the FIG. 17 substrate at a processing sequence subsequent to that depicted by FIG. 17.

An aspect of the invention also contemplates a method of processing a semiconductor substrate that includes providing a semiconductor substrate comprising at least one integrated circuit die, for example any of the embodiments described above. The semiconductor substrate backside is examined to determine the location of portions of at least two of the plurality of conductive vias on a semiconductor substrate backside. From such determined location, the x-y spatial orientation of the semiconductor substrate is determined or ascertained. From said determining of the x-y spatial orientation of the semiconductor substrate, a dielectric layer received over the substrate backside is lithographically patterned to form openings therein to at least some of the conductive vias on the substrate backside. For example, FIG. 20 depicts substrate 17 after removal of a substrate carrier 45 (not necessarily required), and the deposition of a dielectric layer 80 thereover. An opening 82 is depicted as being received through dielectric layer 80 to conductive via 100 on substrate backside 14. Accordingly, backside alignment marks, for example as described and created above, are examined and utilized to determine the x-y orientation of a substrate for lithographically processing a dielectric layer on a substrate backside.

Figure 21:
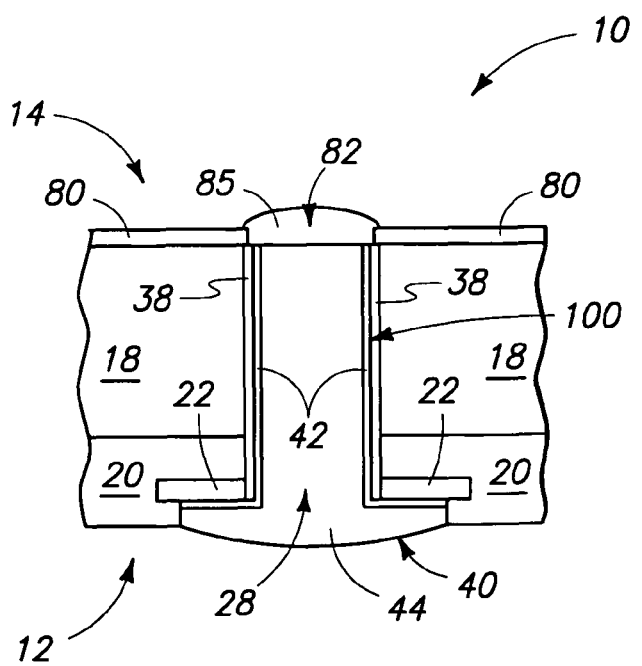
FIG. 21 is a view of the FIG. 20 substrate at a processing sequence subsequent to that depicted by FIG. 20.

Referring to FIG. 21, conductive material 85 has been formed on substrate backside 14 within dielectric openings 82 in electrical connection with conductive vias 100 on substrate backside 14. Additional depositions and/or processing (s) might also of course occur.

Aspects of the invention also contemplate semiconductor devices independent of the method of fabrication and independent of the methods described above, although not precluding and including of the above-described constructions and processings.

In one implementation or aspect, a semiconductor device comprises a semiconductor substrate having at least one integrated circuit die, a circuit side and a backside, and a plurality of material-filled vias. The material-filled vias comprise backside alignment marks defining at least two substrate backside areas that are x-y unique relative to other substrate backside areas to be usable to determine the x-y spatial orientation of the semiconductor substrate. In one implementation, at least some of the material in at least one of the at least two material-filled vias comprises conductive material that extends from the circuit side to the backside. Other and preferred constructions and attributes can be as described above in connection with any of the above embodiments.

In one implementation or aspect, a semiconductor device comprises a semiconductor substrate having at least one integrated circuit die, a circuit side and a backside, and a plurality of through wafer interconnects extending from the circuit side to the backside. At least two of the plurality of through wafer interconnects have some unique backside x-y shape relative to all other through wafer interconnects but said at least two through wafer interconnects. Construction and other attributes as described in any of the above embodiments might also be employed.

In one implementation or aspect, a semiconductor device comprises a semiconductor substrate having at least one integrated circuit die, a circuit side and a backside, and a plurality of through wafer interconnects extending from the circuit side to the backside. The plurality of through wafer interconnects are of common backside x-y shape. At least two pairs of immediately adjacent through wafer interconnects are backside spaced apart differently than are all other pairs of immediately adjacent through wafer interconnects to be usable to determine the x-y spatial orientation of the semiconductor substrate. Construction and other attributes can be as described above with respect to the exemplary described embodiments.

In one implementation or aspect, a substrate comprises at least one die site. A circuit is received within said die site. A first structure extends from one side of the substrate to a second side of the substrate and in electrical communication with the circuit. A second structure extends from said one side to said second side. The second structure is electrically insulative and spaced from said circuit. In one implementation, the second structure is outside of the die site. In one implementation, the first and second structures define different cross-sections at the second side.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of processing a semiconductor device, comprising:
   providing a semiconductor substrate; and
   forming a conductive circuitry via and a non-circuitry alignment mark from a substrate frontside completely through the substrate using at least one common fabrication act, the non-circuitry alignment mark being configured to be distinguishable from the conductive circuitry via at a substrate backside;
   examining the substrate backside to determine location of the non-circuitry alignment mark on the substrate backside; and
   from the determined location, determining x-y spatial orientation of the semiconductor substrate and operably connecting components of another substrate with the conductive circuitry via on the substrate backside.

2. The method of claim 1 wherein said fabrication act comprises etching at least one via site and at least one alignment mark site simultaneously.

3. The method of claim 1 wherein said fabrication act comprises filling at least one via site and at least one alignment mark site simultaneously.

4. A method of determining x-y spatial orientation of a semiconductor substrate comprising an integrated circuit, comprising:
   providing a semiconductor substrate comprising at least one integrated circuit die, the semiconductor substrate comprising a circuit side and a backside, a plurality of conductive vias extending completely through the semiconductor substrate from the circuit side to the backside within area of at least one circuit die;
   examining the plurality of conductive vias on the semiconductor substrate backside to determine location of portions of at least two of the plurality of conductive vias on the semiconductor substrate backside, two of said at least two being of a common backside x-y shape relative to one another configured to operate as an alignment mark, multiple of other of the plurality of conductive vias being of at least one backside x-y shape which is different from said common backside x-y shape and operably connecting with conductive bond pads formed on the semiconductor substrate circuit side; and
   from the determined location, determining x-y spatial orientation of the semiconductor substrate in which other components of another substrate operably connect with the multiple of other of the plurality of conductive vias on the substrate backside in turn operably connected with conductive bond pads formed on the substrate circuit side.

5. The method of claim 4 wherein the examining comprises optically viewing the plurality of conductive vias on the semiconductor substrate backside.

6. The method of claim 4 wherein providing the semiconductor substrate comprises providing the semiconductor substrate to comprise a plurality of die.

7. The method of claim 4 wherein the semiconductor substrate is provided to comprise no more than one integrated circuit die.

8. The method of claim 4 wherein the semiconductor substrate is provided such that said at least two conductive vias operably connect with conductive bond pads formed on the circuit side of the substrate.

9. The method of claim 4 wherein none of said at least two operably connects with any operable circuit device component of any integrated circuit die.

10. The method of claim 4 wherein the semiconductor substrate comprises a backside-thinned substrate.

11. The method of claim 4 comprising globally thinning the semiconductor substrate from the substrate backside prior to said examining.

12. The method of claim 4 wherein the semiconductor substrate is provided such that said at least two of the plurality of conductive vias have some unique backside x-y shape relative to all other conductive vias but said at least two.

13. The method of claim 4 wherein the portions comprise all of the at least two of the plurality of conductive vias.

14. The method of claim 4 wherein said providing comprises forming through wafer interconnects and forming the plurality of conductive vias, said formings comprising a masking step that is common to fabrication of the through wafer interconnects and said at least two of the plurality of conductive vias.

15. The method of claim 14 wherein at least one of said at least two comprises a through wafer interconnect.

16. The method of claim 14 wherein at least two of said at least two comprises a through wafer interconnect.

17. The method of claim 14 wherein all of said at least two comprise a through wafer interconnect.

18. A method of positioning a substrate comprising an integrated circuit, comprising:
   positioning a semiconductor substrate to a first x-y spatial orientation, the semiconductor substrate comprising at least one integrated circuit die, the semiconductor substrate comprising a circuit side and a backside, a plurality of conductive vias extending completely through the semiconductor substrate from the circuit side to the backside within area of at least one circuit die;

examining the plurality of conductive vias on the semiconductor substrate backside to determine location of portions of at least two of the plurality of conductive vias on the semiconductor substrate backside, two of said at least two being of a common backside x-y shape relative to one another configured to operate as an alignment mark, multiple of other of the plurality of conductive vias being of at least one backside x-y shape which is different from said common backside x-y shape and operably connecting with conductive bond pads formed on the semiconductor substrate circuit side; and moving the semiconductor substrate into a second x-y spatial orientation of a desired x-y spatial orientation in response to the first x-y spatial orientation not being the desired second x-y spatial orientation in which other components of another substrate operably connect with the multiple of other of the plurality of conductive vias on the substrate backside in turn operably connected with conductive bond pads formed on the substrate circuit side.

19. A method of processing a substrate comprising an integrated circuit, comprising:

positioning a semiconductor substrate to a first x-y spatial orientation, the semiconductor substrate comprising at least one integrated circuit die, the semiconductor substrate comprising a circuit side and a backside, a plurality of conductive vias extending completely through the semiconductor substrate from the circuit side to the backside within area of at least one circuit die;

examining the plurality of conductive vias on the semiconductor substrate backside to determine location of portions of at least two of the plurality of conductive vias on the semiconductor substrate backside, two of said at least two being of a common backside x-y shape relative to one another configured to operate as an alignment mark, multiple of other of the plurality of conductive vias being of at least one backside x-y shape which is different from said common backside x-y shape and operably connecting with conductive bond pads formed on the semiconductor substrate circuit side;

deciding from the determined location whether the first x-y spatial orientation conforms to a desired x-y spatial orientation of the semiconductor substrate in which other components of another substrate operably connect with the multiple of other of the plurality of conductive vias on the substrate backside in turn operably connected with conductive bond pads formed on the substrate circuit side; and if from said deciding the semiconducting substrate is not spatially oriented as desired, moving the semiconductor substrate into a second x-y spatial orientation of the desired x-y spatial orientation.

20. The method of claim 19 comprising deciding from the determined location that the first x-y spatial orientation does not conform to the desired x-y spatial orientation of the semiconductor substrate, and thereafter conducting said moving.

21. The method of claim 19 comprising deciding from the determined location that the first x-y spatial orientation conforms to the desired x-y spatial orientation of the semiconductor substrate, and thereafter conducting at least one act upon said semiconductor substrate before any moving of the semiconductor substrate from said desired x-y spatial orientation.

22. The method of claim 19 comprising globally thinning the semiconductor substrate from the substrate backside prior to said examining, said examining comprising optically viewing the plurality of conductive vias on the semiconductor substrate backside after the globally thinning.

23. A method of processing a semiconductor substrate, comprising:

providing a semiconductor substrate comprising at least one integrated circuit die, the semiconductor substrate comprising a circuit side and a backside, a plurality of conductive vias extending completely through the semiconductor substrate from the circuit side to the backside within area of at least one circuit die;

examining the semiconductor substrate backside to determine location of portions of at least two of the plurality of conductive vias on the semiconductor substrate backside, two of said at least two being of a common backside x-y shape relative to one another configured to operate as an alignment mark, multiple of other of the plurality of conductive vias being of at least one backside x-y shape which is different from said common backside x-y shape and operably connecting with conductive bond pads formed on the semiconductor substrate circuit side;

from the determined location, determining x-y spatial orientation of the semiconductor substrate;

from said determining of the x-y spatial orientation of the semiconductor substrate, lithographically patterning a dielectric layer received over the substrate backside to form openings in the dielectric layer to at least the multiple of other of the plurality of conductive vias on the substrate backside; and forming conductive material on the substrate backside within the dielectric layer openings in electrical connection with the multiple of other of the plurality of conductive vias on the substrate backside in turn operably connecting with conductive bond pads formed on the substrate circuit side.

24. A method of processing a semiconductor substrate, comprising:

providing a semiconductor substrate comprising a frontside and a backside;

fabricating an integrated circuit relative to the semiconductor substrate frontside, the fabricating comprising lithographically patterning the semiconductor substrate frontside, the lithographically patterning comprising:

formation of at least two backside alignment mark openings by etching the at least two backside alignment mark openings into the substrate from the substrate frontside; and formation of at least two through wafer interconnect openings by etching the at least two through wafer interconnect openings into the substrate from the substrate frontside;

filling the at least two alignment mark openings and the at least two through wafer interconnect openings with material;

after the filling, globally thinning the semiconductor substrate by removing substrate material from the substrate backside, the removing exposing at least two filled backside alignment marks and at least two filled through wafer interconnects, the at least two backside alignment marks being of a common backside x-y shape relative to one another configured to operate as an alignment mark and the at least two through wafer interconnects being of at least one backside x-y shape which is different from the common backside x-y shape and operably connecting with the integrated circuit;

after the thinning, examining the semiconductor substrate backside to determine location of the filled at least two backside alignment marks on the semiconductor substrate backside; and from the determined location, determining x-y spatial orientation of the semiconductor substrate and operably connecting components of another substrate with the at least two through wafer interconnects on the substrate backside in turn operably connected with the integrated circuit relative to the substrate frontside.

25. The method of claim 24 wherein said etching of the backside alignment mark openings is not completely through the substrate to the substrate backside, the globally thinning comprising removing substrate material from the substrate backside at least to a point of exposing the filled at least two alignment mark openings on the semiconductor substrate backside.

26. The method of claim 24 comprising forming through wafer interconnects, said forming comprising a masking step, said at least two backside alignment marks being lithographically patterned using a masking step that is common to the masking step of said forming.

27. The method of claim 24 wherein at least one of said at least two alignment marks comprises at least one conductive via which does not operably connect with any operable circuit device component of the integrated circuit.

28. The method of claim 1 wherein the semiconductor substrate comprises integrated circuit die, the non-circuitry alignment mark being formed within the integrated circuit die.

29. The method of claim 1 wherein the semiconductor substrate comprises a plurality of integrated circuit die having street area therebetween, the non-circuitry alignment mark being formed within the street area.

30. The method of claim 4 wherein said two of at least two of the conductive vias operably connect with operable circuit device components of integrated circuit die.

31. The method of claim 4 wherein the common shape has a straight side and the at least one different backside x-y shape has a curved side.

32. The method of claim 31 wherein the common shape has at least four straight sides and the at least one different backside x-y shape is circular.

33. The method of claim 32 wherein the common shape is square.

34. The method of claim 19 wherein the common shape has a straight side and the at least one different backside x-y shape has a curved side.

35. The method of claim 34 wherein the common shape has at least four straight sides and the at least one different backside x-y shape is circular.

36. The method of claim 35 wherein the common shape is square.

37. The method of claim 23 wherein the common shape has a straight side and the at least one different backside x-y shape has a curved side.

38. The method of claim 37 wherein the common shape has at least four straight sides and the at least one different backside x-y shape is circular.

39. The method of claim 38 wherein the common shape is square.

40. The method of claim 24 wherein the common shape has a straight side and the at least one different backside x-y shape has a curved side.

41. The method of claim 40 wherein the common shape has at least four straight sides and the at least one different backside x-y shape is circular.

42. The method of claim 41 wherein the common shape is square.

* * * * *